United States Patent
Sivadas et al.

(10) Patent No.: US 8,326,371 B2
(45) Date of Patent: Dec. 4, 2012

(54) DC CURRENT BASED ON CHIP RF POWER DETECTION SCHEME FOR A POWER AMPLIFIER

(75) Inventors: Apu Sivadas, Bangalore (IN); Gireesh Rajendran, Trivandrum (IN); Ashish Lachhwani, Bangalore (IN); David Cohen, Kfar-Saba (IL)

(73) Assignee: Texas Instruments Incorporated, Dallas, TX (US)

( * ) Notice: Subject to any disclaimer, the term of this patent is extended or adjusted under 35 U.S.C. 154(b) by 1017 days.

(21) Appl. No.: 12/234,731

(22) Filed: Sep. 22, 2008

(65) Prior Publication Data

US 2010/0075724 A1    Mar. 25, 2010

(51) Int. Cl.
*H04B 1/00* (2006.01)
(52) U.S. Cl. ............... 455/571; 455/562.1; 455/572; 330/10; 330/290
(58) Field of Classification Search .......... 455/571, 455/562.1, 572, 574, 575.7, 91, 121, 127.1, 455/127.4, 127.5, 130, 193.1, 195.1, 311, 455/19, 24, 39, 522, 73; 330/10, 290, 279, 330/289, 288, 144
See application file for complete search history.

(56) References Cited

U.S. PATENT DOCUMENTS

| | | | |
|---|---|---|---|
| 6,188,212 B1* | 2/2001 | Larson et al. ............. | 323/281 |
| 6,701,138 B2* | 3/2004 | Epperson et al. ......... | 455/127.3 |
| 7,177,610 B2* | 2/2007 | Scott et al. ............... | 455/259 |
| 7,333,778 B2* | 2/2008 | Pehlke et al. ............. | 455/114.3 |
| 7,551,027 B2* | 6/2009 | Salove et al. ............. | 330/140 |
| 7,787,563 B2* | 8/2010 | Tal et al. ................... | 375/297 |
| 7,851,940 B2* | 12/2010 | Mahin et al. ............. | 307/11 |
| 7,962,109 B1* | 6/2011 | Stockstad et al. ........ | 455/115.1 |

* cited by examiner

*Primary Examiner* — Nay A Maung
*Assistant Examiner* — Chung-Tien Yang
(74) *Attorney, Agent, or Firm* — Ronald O. Neerings; Wade J. Brady, III; Frederick J. Telecky, Jr.

(57) ABSTRACT

A method, system, and apparatus of a DC current based on chip RF power detection scheme for a power amplifier are disclosed. In one embodiment, a method includes generating a scaled current from an other current associated with power amplifier, transforming the scaled current (e.g., the scaled current may be scaled to the other current value) into a digital signal and using the digital signal to set a radio frequency power value of an antenna of the antenna module. The method may include transforming the scaled current into a voltage signal. The method may also include transforming the voltage signal into the digital signal. The method may also include generating a current mirror from a low dropout regulator.

17 Claims, 7 Drawing Sheets

DC CURRENT BASED ON CHIP RF POWER DETECTION SCHEME FOR A POWER AMPLIFIER

FIELD OF TECHNOLOGY

This disclosure relates generally to an enterprise method, a technical field of software and/or hardware technology and, in one example embodiment a DC current based on-chip radio frequency (RF) power detection scheme for a power amplifier.

BACKGROUND

A wireless device (e.g., a cellular telephone, a mobile communication device, etc.) may be powered by a power source (e.g., a battery). The power source may have a threshold lifetime of use (e.g., a battery may lose energy over a particular period of use). The wireless device may use an antenna (e.g., a component designed to send and/or receive radio waves) to transmit a signal (e.g., a radio frequency (RF) signal). The signal may originate in an integrated circuit of the wireless device. The integrated circuit may communicate a power signal. The power signal may be amplified using an amplifier (e.g., a device that changes the amplitude of a signal, an inverting amplifier) associated with the antenna. The amplifier may draw energy from the power source to amplify the signal. Thus, the antenna may consume a threshold amount of power.

The wireless device may have a feedback circuit (e.g., a sensing circuit, a rectifier circuit, a filter circuit, etc.) that may be used to monitor and/or control the power use of the amplifier. The feedback circuit may be coupled to the antenna and/or the amplifier. The feedback circuit may act as an additional load (e.g., increase resistance to the signal) of the antenna circuit when coupled to the antenna. This may increase the power used by the antenna to transmit the signal.

Furthermore, when monitoring the power use of the amplifier, the feedback circuit may not be able to distinguish between an actual power (e.g., a power value with a real number value and/or radiated transmitted power) and/or a total power (e.g., a power value which includes the reactive and active power). The amplifier may operate according to the total power and not the actual power. Thus, a feedback power value communicated to the amplifier may not be accurate. Additionally, the feedback circuit may be comprised of multiple components that may increase the design complexity of the wireless device. Consequently, the feedback circuit may require extra space and/or increase a cost of the wireless device.

SUMMARY

A method, system, and apparatus for a DC current based on chip radio frequency (RF) power detection scheme for a power amplifier are disclosed. In one aspect, a method includes generating a scaled current from an other current associated with an antenna module, transforming the scaled current into a digital signal, and using the digital signal to set a radio frequency power value of an antenna of the antenna module.

The scaled current may be generated by a current mirror circuit coupled with a low dropout regulator (LDO). The LDO may be coupled with a power amplifier (PA). The PA may be used to drive the antenna module. The scaled current may be scaled to the value of the other current associated with the PA. The method may include transforming the scaled current into a voltage signal. The method may also include transforming the voltage signal into the digital signal. The current may be scaled to a value of 50 to 500 times less than the other current. The other current may be a direct current (DC) drain current of the power amplifier. The current mirror circuit may be a transistor coupled to an other transistor of the LDO. A width value and/or a length value of the transistor may be scaled to an other width value and an other length value of the other transistor. The PA may be a differential PA and/or a single-ended PA. The current mirror circuit may include transistors coupled to the other transistor of the LDO. The transistors may be programmable according to a transistor control module.

The method may include using an analog to digital converter (ADC) module to convert the scaled current to the digital signal. The method may also include setting the value of the digital signal that may be an output of the ADC module according to a specified relation equation that may relate a transmitting radio frequency power value of the antenna module with a value of the other current consumed by PA. The ADC module may be located in a receiver circuit of a transceiver circuit associated with the antenna module. The transceiver circuit may be based on time division multiplexing (TDM) and/or frequency division multiplexing (FDM).

The method may include injecting the scaled current through an intermediate frequency (IF) amplifier in order to transform the current into the voltage signal. The specified relation equation used in this process may be $P_{RF}=a(I_{DC}-I_0)2+b(I_{DC}-I_0)+c$ where a, b and c may be constant gain parameters, $I_0$ may be an offset correction, and $I_{DC}$ may be the value of the other current. The IF amplifier may include a resistor with a specified value through which the scaled current may be injected into the ADC module. The method may include configuring an NMOS current mirror to sink the scaled current.

In another aspect, a system may include a power amplifier (PA) module to provide a drain current. The PA module may be associated with an antenna and/or a sense module. The sense module may generate a mirror current proportional to the drain current with a current mirror (e.g current mirror circuit). A converter module, also associated with the PA and the current mirror, may convert the mirror current into a digital signal used to set a transmitting radio frequency power of the antenna. The converter module may be an existing analog to digital converter (ADC) of a receiver circuit of a transceiver associated with the antenna module.

The system may include a digital base banding (DBB) module to use the digital signal to set the transmitting radio frequency power of the antenna module in real time. The transceiver may be based on a time division multiplexing. A low dropout regulator (LDO) pass transistor may provide the drain current. The current mirror may be coupled with a transistor of the LDO pass transistor. The PA module may be selected from a group that may include a substantially class-A PA, a class A-B PA, a class-B PA, a class-C PA, a deep class-C PA and a switch-typed PA.

The converter module may be a resistor coupled to an IF amplifier and an ADC module. The IF amplifier may be used to convert the mirror current to a voltage signal and/or to terminate the resistor. The converter module may contain an n-channel MOSFET current mirror to sink the mirror current. The sense module may use several programmable current mirrors to generate the mirror current.

In yet another aspect, a method includes configuring a power amplifier of an antenna circuit with a current mirror to generate a mirror current proportionally related (e.g. scaled) to a drain current of the power amplifier, configuring an analog to digital converter circuit to convert the mirror current to a digital signal proportionally related to the drain current of the power amplifier, and configuring a control module to use the digital signal to set transmitting radio frequency power value of an antenna in real time according to a relationship between the digital signal and the drain current.

The method may include configuring an ADC module of a transceiver associated with the antenna to convert the mirror current to a digital signal. The method may include creating an index to relate the transmitting radio frequency value to the drain current using the equation $P_{RF}=a(I_{DC}-I_0)^2+b(I_{DC}-I_0)+c$ where a, b and c may be constant gain parameters, $I_0$ may be an offset correction, and $I_{DC}$ may be the value of the other current associated with the PA. The method may include using the index to set the transmitting radio frequency value of the antenna in real time according to the relationship between the digital signal and the drain current. The current mirror may be coupled to a final stage LDO associated with the power amplifier.

The methods, systems, and apparatuses disclosed herein may be implemented in any means for achieving various aspects, and may be executed in a form of a machine-readable medium embodying a set of instructions that, when executed by a machine, cause the machine to perform any of the operations disclosed herein. Other features will be apparent from the accompanying drawings and from the detailed description that follows.

BRIEF DESCRIPTION OF THE DRAWINGS

Example embodiments are illustrated by way of example and not limitation in the figures of the accompanying drawings, in which like references indicate similar elements and in which.

Figure 1:
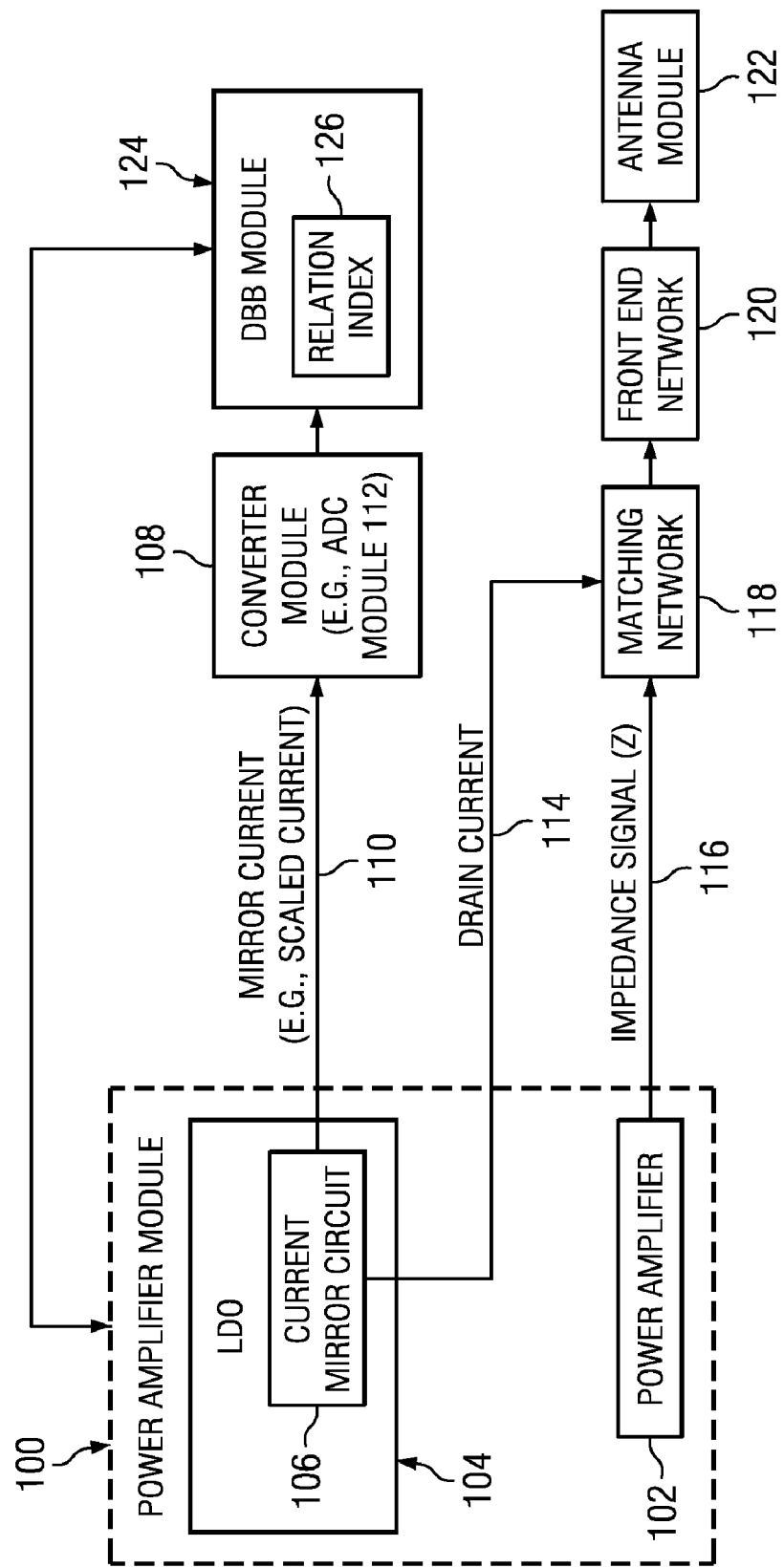
FIG. 1 is a system view illustrating measurement of the power that may be used by an antenna module to transmit the signal, according to one embodiment.

Other features of the present embodiments will be apparent from the accompanying drawings and from the detailed description that follows.

DETAILED DESCRIPTION

A method, system, and apparatus to a DC current based on chip RF power detection scheme for a power amplifier are disclosed. Although the present embodiments have been described with reference to specific example embodiments, it will be evident that various modifications and changes may be made to these embodiments without departing from the broader spirit and scope of the various embodiments.

In one embodiment, a method includes generating a scaled current (e.g., may be a mirror current 110 of FIG. 1) (e.g., may be using a sense module 206 of FIG. 2) from an other current (e.g. a drain current 114 of FIG. 1 of a power amplifier 100 of FIG. 1) associated with an antenna module (e.g., the antenna module 122 of FIG. 1), transforming the scaled current into a digital signal, and using the digital signal to set a radio frequency power value of an antenna (e.g., the antenna 222 of FIG. 2) of the antenna module 122.

In another embodiment, a system includes a power amplifier (PA) module (e.g., the power amplifier module 100 of FIG. 1) to provide a drain current (e.g., the drain current 114 of FIG. 1) and the PA 102 is associated with an antenna (e.g., the antenna 222 of FIG. 2), a sense module (e.g., the sense module 206 of FIG. 2) to generate a mirror current (e.g., the mirror current 110 of FIG. 1) proportional to the drain current 114 with a current mirror (e.g., of a current mirror circuit 106 of FIG. 1), and a converter module (e.g., the converter module 108 of FIG. 1) to convert the mirror current 110 into a digital signal used to set a radio frequency power of the antenna 222.

In yet another embodiment, a method includes configuring a power amplifier (e.g., the power amplifier 102 of FIG. 1) of an antenna circuit (e.g., the antenna module 122 of FIG. 1) with a current mirror to generate a mirror current (e.g., the mirror current 110 of FIG. 1) proportionally related to a drain current (e.g., the drain current 114 of FIG. 1) of the power amplifier 102, configuring an analog to digital converter circuit (e.g., of a ADC module 112 of FIG. 1) to convert the mirror current 110 to a digital signal proportionally related to the drain current 114 of the power amplifier 102, and configuring a control module (e.g., the control module 300 of FIG. 3) to use the digital signal to set an antenna transmitted RF Power value of an antenna (e.g., the antenna 222 of FIG. 2) in real time according to a relationship between the digital signal and the drain current 114.

FIG. 1 is a system view illustrating a measurement of the power that may be used by an antenna module to transmit the signal, according to one embodiment. Particularly, FIG. 1 illustrates a power amplifier module 100, a power amplifier 102, a LDO 104, a current mirror circuit 106, a converter module 108, a mirror current (e.g., scaled current) 110, an ADC module 112, a drain current 114, an impedance signal 116, a matching network 118, a front end network 120, an antenna module 122, a DBB module 124, and a relation index 126, according to one embodiment.

The power amplifier module 100 may be a module that may include the power amplifier 102 to draw the current from the LDO 104 and amplify the current (e.g., the mirror current 110). The power amplifier module 100 may be used to drive the antenna module 122. The power amplifier 102 (e.g., may be made up of CMOS transistors) may be associated with an antenna (e.g., the antenna 222 of FIG. 2) that may be used to transmit the power. The power amplifier 102 may be a device that changes (e.g., increases) the amplitude of a signal. The signal may be voltage or current. The low dropout regulator (LDO) may be a DC linear voltage regulator which may operate (e.g., to provide the drain current 114) with a small input-output differential voltage (e.g., may enable regulation for small voltage conversions). The current mirror circuit 106 may be the circuit (e.g., may include the transistor, the resistor, etc.) that may generate a mirror current 110 (e.g., scaled current) from an original current (e.g. other current, drain current 114) of a main circuit. The mirror current may be scaled to the value of the original current. The converter module 108 (e.g., the ADC module 112) may be a conversion module that may convert the analog signal to a digital signal. The mirror current 110 generated from the regulator (e.g., the LDO 104) may be the scaled mirror current (e.g., may be by a factor that may designed by the architect) that may be converted into a digital signal used to adjust (e.g., set) a radio frequency power of the antenna.

The ADC (Analog to Digital Converter) module 112 may convert an analog signal (e.g., the mirror current 110) to the digital signal (e.g., a discrete time signal that may be proportional to the drain current 114). The drain current 114 may be the current (e.g., the output) that may be delivered from the power amplifier 102 drain to a matching network 118. The impedance signal 116 (e.g., Z) may be a signal that may maximize the power transfer (e.g., to the antenna module 122) and minimize the reflections from the load (e.g., the power amplifier 102).

The matching network 118 may be a filter that may transmit the required signal (e.g., the impedance signal). The matching network 118 may also be used for matching function (e.g., may translate the value of the power amplifier 102). The front end network 120 may be the circuit (e.g., the switch, the filter, etc.) that may be connected to the matching network 118, and the antenna module 122 that may enable the signal communication. The antenna module 122 may include antenna (e.g., helix antenna, parabola antenna, RF antenna, etc.) and /or other radio frequency circuitries that may be required for transmission/receiving the signal (e.g., RF signal, etc.). The digital base banding (DBB) 124 may be the software/hardware digital processor that may be used to process (e.g., over a wide range of frequencies) a given signal (e.g., the digital signal, etc.). The relation index 126 may be the index that may set the transmitted RF Power value (e.g., may be the antenna 222) in real time (e.g., according to the relationship between the digital signal and the drain current 114). The LDO 104 may generate the DC voltages used to operate the PA 102. The LDO 104 may maintain a constant DC output voltage as the current drawn from it varies within a threshold range.

In example embodiment, the power amplifier module 100 may include the power amplifier 102, and the LDO 104. The LDO 104 may include the current mirror circuit 106 that may generate the mirror current 110 (e.g., the scaled current) to the converter module 108 and may provide the drain current 114 to the matching network 118. The converter module 108 may include the ADC module 112 that may be connected to the DBB module 124. The power amplifier 102 may send the impedance signal (e.g., Z) 116 to the matching network 118 that may match and send the required signal. The drain current 114 may be the output of the current mirror circuit 106 of the LDO 104. The drain current 114 may be provided to front end network 120 through the matching network 118. The matching network 118 may be coupled with the antenna module 122.

In one embodiment, the scaled current (e.g., the mirror current 110) from an other current (e.g. the drain current 114) may be generated (e.g., using the sense module 206 of FIG. 2) associated with the antenna module 122. The scaled current may be transformed (e.g., using the converter module 108) into a digital signal. The digital signal may be used (e.g., using the converter module 108) to set a transmitted RF Power value of an antenna (e.g., the antenna 222 of FIG. 2) of the antenna module 122. The current mirror circuit 106 may generate the scaled current (e.g., using the sense module 206 of FIG. 2) coupled with both a low dropout regulator (LDO) 104 and the power amplifier (PA) 102 used to drive the antenna module 122. The scaled current may be scaled to the other current value (e.g., scaled to the drain current). The scaled current may be transformed (e.g., using an IF amplifier 508 of FIG. 5) into a voltage signal.

The voltage signal may be transformed (e.g., using the converter module 108) into the digital signal. The scaled current may be scaled to a value of 50 to 500 times less than the other current. The other current may be a direct current (DC) of the power amplifier 102. The PA 102 may be a differential PA and/or a single-ended PA. The current mirror circuit 106 may include transistors coupled to the other transistor of the LDO 104. The analog to digital converter (ADC) module 112 may be used (e.g., using the converter module 108) to convert the scaled current to the digital signal. The value of the digital signal may be settled (e.g., using the digital base band module (DBB) 124) according to a specified relation equation that may relate the transmitted RF Power value of the antenna module 122 with a value of the other current consumed by the power amplifier 102 (PA). The specified relation equation used in this process may be $P_{RF}=a(I_{DC}-I_0)2+b(I_{DC}-I_0)+c$ where a, b and c may be constant gain parameters, $I_0$ may be an offset correction, and $I_{DC}$ may be the value of the other current. (For a pure Class-A PA, the constants a, b, $I_0$ may be evaluated once and stored in memory).

The ADC module 112 may be located in a receiver circuit of a transceiver circuit associated with the antenna module 122. The transceiver circuit may include a time division multiplexer (TDM). Time division multiplexing may be a type of digital and/or analog multiplexing in which two or more signals or bit streams may be transferred apparently simultaneously as sub-channels in one communication channel, but are physically taking turns on the channel. The transceiver circuit may include a frequency division multiplexer (the frequency division multiplexer transceiver 302 of FIG. 3). Frequency division multiplexing may be a form of signal multiplexing where multiple baseband signals are modulated on different frequency carrier waves and added together to create a composite signal. An NMOS current mirror may be configured (e.g., using the converter module 108) to sink the scaled current. The power amplifier (PA) module 100 may provide the drain current 114. The PA 102 may be associated with the antenna 222 of FIG. 2. The converter module 108 may convert the mirror current 110 into a digital signal used to set a transmitted RF Power value of the antenna 222.

The digital base banding (DBB) module 124 may use the digital signal to set the transmitted RF power value power of the antenna module 122 in real time. The converter module 108 may be an existing analog to digital converter (ADC) of a receiver circuit of a transceiver (e.g., the FDM transceiver 302 of FIG. 3, TDM transceiver, etc.) associated with the antenna module 122. The LDO pass transistor of the PA 100 may provide the drain current 114. The current mirror circuit 106 may be coupled in series with a transistor of the LDO pass transistor (e.g., a NMOS transistor, a PMOS transistor, etc.). The PA module 100 may be selected from a group that may include substantially class-A PA, a class A-B PA, a class-B PA, a class-C PA, a deep class-C PA and/or a switch-typed PA.

The converter module 108 may be a resistor coupled to an IF amplifier (e.g., the IF amplifier 508 of FIG. 5) and/or an analog to digital converter (ADC) 112. The converter module 108 may contain n-channel MOSFET current mirror to sink the mirror current 110 (e.g., scaled current). The power amplifier 102 of the antenna circuit may be configured with a current mirror to generate the mirror current 110 (e.g., using the sense module 206 of FIG. 2) proportionally related to a drain current 114 of the power amplifier 102. The analog to digital converter circuit may be configured to convert (e.g., using the converter module 108) the mirror current 110 to a digital signal proportionally related to the drain current 114 of the power amplifier 102. The current mirror may be coupled to a final stage low dropout regulator (LDO) 104 associated with the power amplifier 102.

Figure 2:
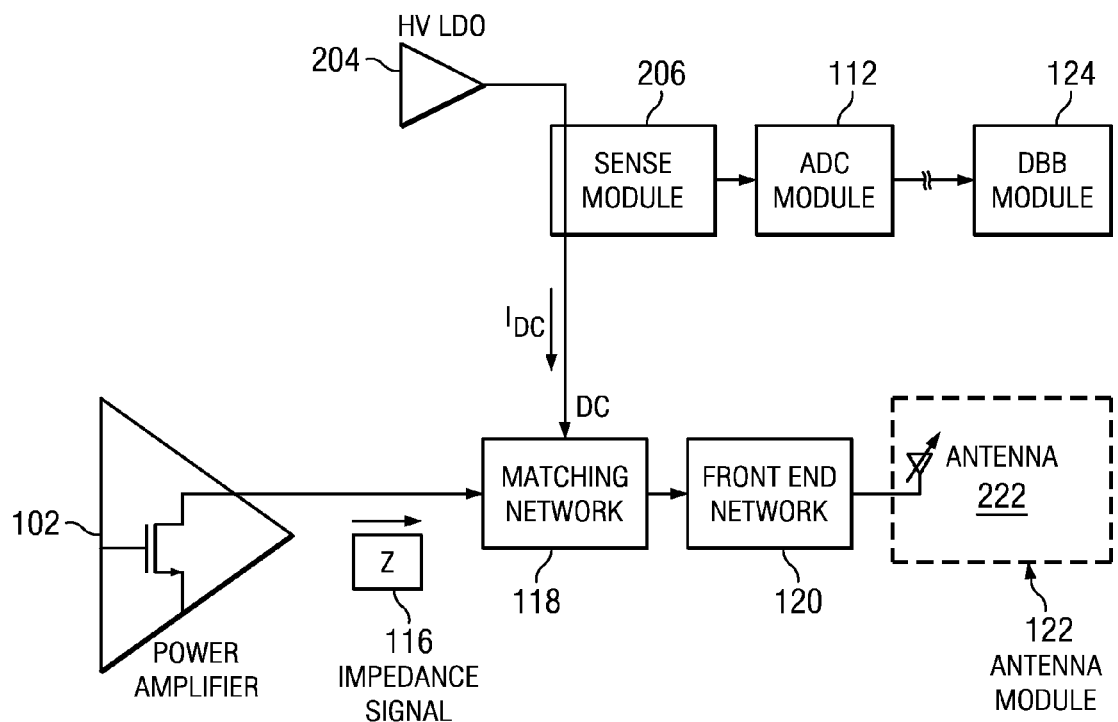
FIG. 2 is a system view of replicating a DC power and using the DC power to tune the antenna module, according to one embodiment.

FIG. 2 is a system view of replicating a DC power and using the DC power to tune the antenna module, according to one embodiment. Particularly, FIG. 2 illustrates the power amplifier 102, the ADC module 112, the impedance (Z) 116, the matching network 118, the front end network 120, the antenna module 122, the DBB module 124, a high voltage (HV) LDO 204, sense module 206, and an antenna 222, according to one embodiment.

The HV LDO 204 may generate DC voltage used by the antenna module 122 to transmit signal. The HV LDO 204 may feed the last stage drain of the power amplifier 102. The sense module 206 (e.g., may include the current mirror circuit 106) may sense the direct current supplied to the power amplifier 102 from the HV LDO 204 and supply the current (e.g., DC sense current) to the ADC module 112. The antenna 222 of the antenna module 122 associated with the ADC module 112 may be a component designed to send and/or receive radio frequency signals.

In an example embodiment, the power amplifier 102 may use the current from HV LDO 204 to provide DC current to the matching network 118. The matching network 118 may transmit the required signals (e.g., radio frequency signal etc.) to the front end network 120. The signals from the front end network 120 may be transmitted to the antenna 222 of the antenna module 122. The sense module 206 may sense the direct current and transfer it to the ADC module 112. The ADC module 112 may convert analog signals received from the sense module 206 to digital signals. The digital signals from the ADC module 112 may be communicated to the antenna 222 through the DBB module 124.

In one embodiment, the sense module 206 may generate a mirror current 110 proportional to the drain current 114 with a current mirror. The sense module 206 may use a set of programmable current mirrors (e.g., the programmable current mirrors 306 A-N of FIG. 3) to generate the mirror current 110. The analog to digital converter of the transceiver (e.g., FDM, TDM, etc.) may be configured with the antenna 222 to convert (e.g., using the converter module 108) the mirror current 110 to a digital signal.

The index to relate the antenna transmitted RF power value may be created (e.g., using the power amplifier (PA) module 100) to the drain current 114 with an equation may be $P_{RF} = a(I_{DC}-I_0)^2 + b(I_{DC}-I_0) + c$, where a, b and c are constant gain parameters, $I_0$ is an offset correction, and $I_{DC}$ is the value of the other current. The index to set the antenna transmitted RF Power value of the antenna 222 in real time may be used according to the relationship between the digital signal and the drain current 114.

Figure 3:
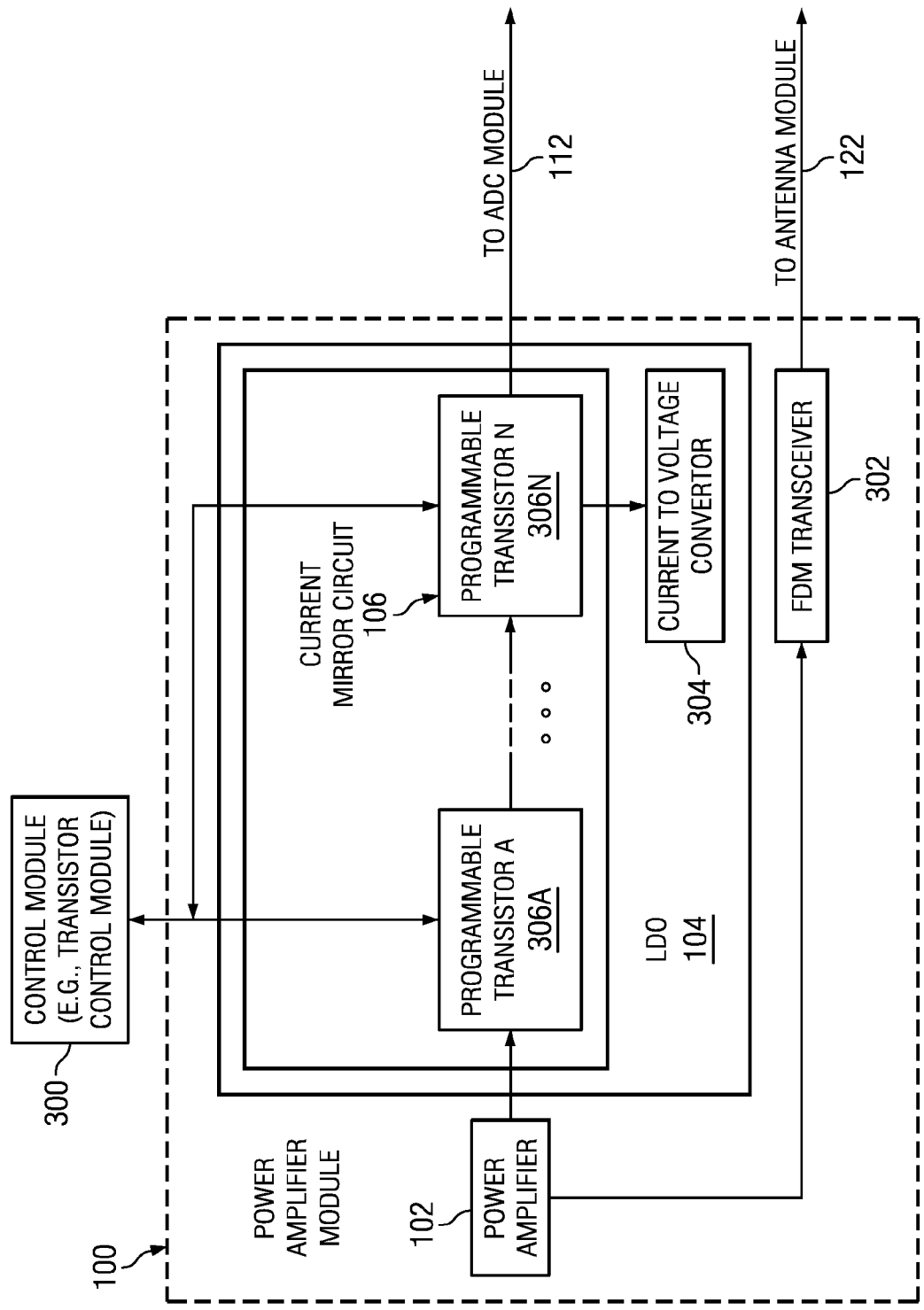
FIG. 3 is an exploded view of the power amplifier module illustrated in FIG. 1, according to one embodiment.

FIG. 3 is an exploded view of the power amplifier module illustrated in FIG. 1, according to one embodiment. Particularly, FIG. 3 illustrates the power amplifier module 100, the power amplifier 102, the LDO 104, the current mirror circuit 106, a control module 300, a frequency division multiplexing (FDM) transceiver 302, a current to voltage converter 304, and a programmable transistor 306A-N, according to one embodiment.

The control module 300 (e.g., transistor control module) may control the programmable transistor 306A-N (e.g., may be programmed according to the transmitter control module) of the current mirror circuit 106. The FDM transceiver 302 may be included in the transceiver circuit that receives and/or transmits the frequency division multiplexed signal (e.g., multiple baseband signals are modulated on different frequency carrier signals and/or added together to create a composite signal). The current to voltage converter 304 may convert the current (e.g., the mirror current 110) to a voltage signal using the IF amplifier 508 of FIG. 5. The programmable transistor 306A-N may be a set of transistors (e.g., may be a semiconductor device commonly used to amplify and/or switch electronic signals) that may be programmed according to the control module 300.

In example embodiment, the power amplifier module 100 may consist of the power amplifier 102, the LDO 104, and/or the FDM transceiver 302. The power amplifier 102 may include the LDO 104. The LDO 104 may include the current mirror circuit consisting of the programmable transistor 306A-N and/or the current to voltage converter 304. The signals from the LDO 104 may be provided to the ADC module 112. The power amplifier 102 may be connected to the FDM transceiver 302. The multiplexed signals from the FDM transceiver 302 may be communicated to the antenna module 122.

In one embodiment, the current mirror circuit 106 may include the transistor (e.g., may be the programmable transistor 306A-N) coupled to an other transistor of the LDO 104. A width value and a length value of the transistor may be scaled to an other width value and an other length value of the other transistor. The transistors (e.g., the programmable transistor 306A-N) may be programmable according to a transistor control module (e.g., the control module 300). The transceiver may be based a time division multiplexing (TDM). The control module 300 (e.g., the transistor control module) may be configured (e.g., using the digital base band (DBB) module 124) to use the digital signal to set an antenna transmitted RF power value of the antenna 222 in real time according to a relationship between the digital signal and the drain current 114.

Figure 4:
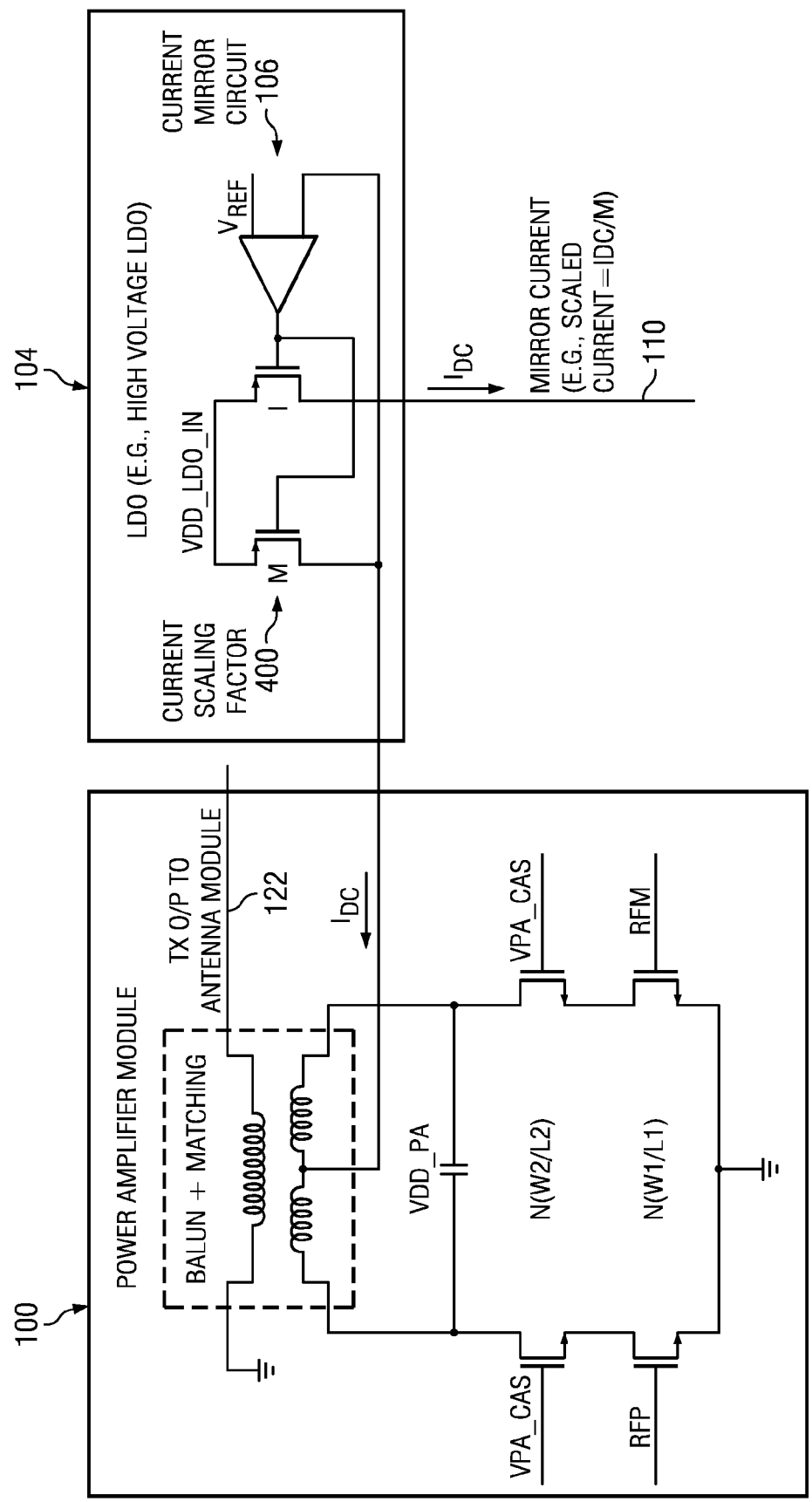
FIG. 4 is a schematic view illustrating a detection of the power amplifier DC current from an LDO, according to one embodiment.

FIG. 4 is a schematic view illustrating a detection of the power amplifier DC current from an LDO, according to one embodiment. Particularly, FIG. 4 illustrates the power amplifier module 100, the LDO (e.g., high voltage LDO) 104, the current mirror circuit 106, the mirror current (e.g., scaled current) 110, a current scaling factor 400, and a transistor (e.g., the current mirror) 402, according to one embodiment.

The current scaling factor 400 may be the current scaled to the value of the other current (e.g., the PA drain current). The transistor (e.g., the current mirror transistor) 402 may be the sense transistor (e.g., may be M times than that of the main LDO pass transistor) that may be coupled to the other transistors of the LDO to minimize the mismatch related errors in current mirroring.

In example embodiment, the power amplifier module 100 may be connected to the LDO 104. The LDO (e.g., high voltage LDO) 104 that may include the transistor (e.g., current mirror) 402, the current mirror circuit 106, the mirror current (e.g., scaled current) 110, and/or the current scaling factor 400. The power amplifier DC current may be sensed from the LDO 104 and the sensed value may be converted to digital form using the ADC module 112 which may be the existing ADC of the transceiver.

Figure 5:
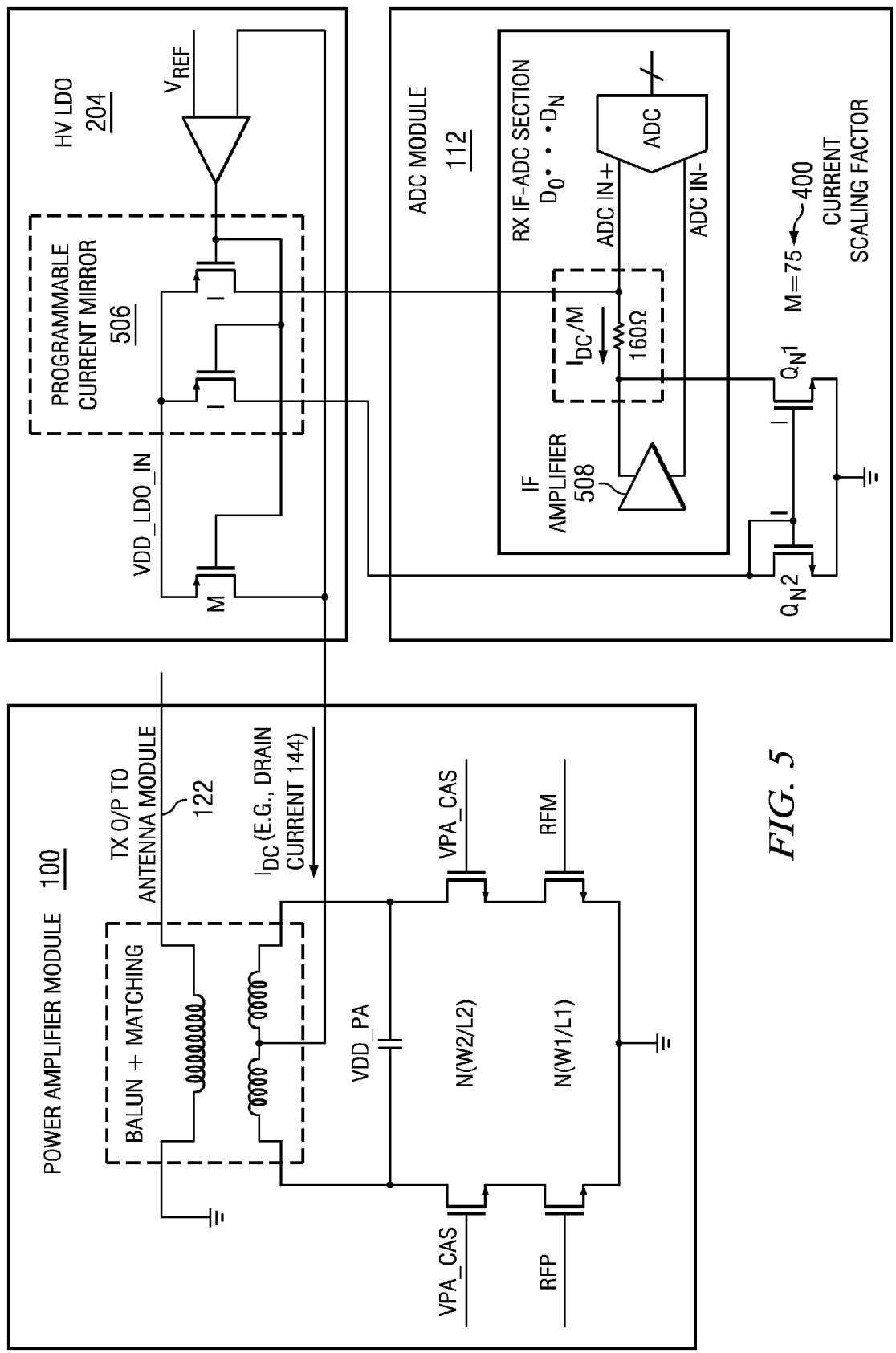
FIG. 5 is a schematic view illustrating the implementation of sensing the current (e.g., $I_{DC}$) through a LDO pass transistor, according to one embodiment.

FIG. 5 is a schematic view illustrating the implementation of sensing the current (e.g., $I_{DC}$) through a LDO pass transistor, according to one embodiment. Particularly, FIG. 5 illustrates the power amplifier module 100, the ADC module 112, the current scaling factor 400, a resistor 500, a programmable current mirror 506, and an IF amplifier 508, according to one embodiment.

The programmable current mirror 506 may include a set of transistors that may be programmable according the transistor module. The programmable current mirror 506 may mirror the current (e.g., power amplifier direct current) obtained from the HV LDO 204. The IF amplifier 508, may be the amplifier that may generate the intermediate frequency that may convert a current value (e.g., the mirror current 110) to a voltage signal.

In example embodiment, the current may be injected through IF amplifier 508 (e.g., located in the ADC module 112) to convert the current (e.g., mirrored current) to voltage. The ADC module 112 may include additional NMOS current mirror Qn2 and Qn1 that may be used to sink the mirror current. The power amplifier module 100 may use a dedicated HV LDO 204 to feed the PA 102 final stage drain. The IF amplifier 508 may be connected to the ADC.

In one embodiment, the scaled current may be injected through an IF amplifier 508 in order to transform the current into the voltage signal. The specified relation equation may be $P_{RF}=a(I_{DC}-I_0)^2+b(I_{DC}-I_0)+c$ where a, b and c are constant gain parameters, $I_0$ may be an offset correction, and $I_{DC}$ may be the value of the other current. The IF amplifier 508 may include a resistor with a specified value through which the scaled current may be injected into the ADC module 112. The IF amplifier 508 may be used to convert the mirror current to a voltage signal and/or to terminate the resistor.

Figure 6:
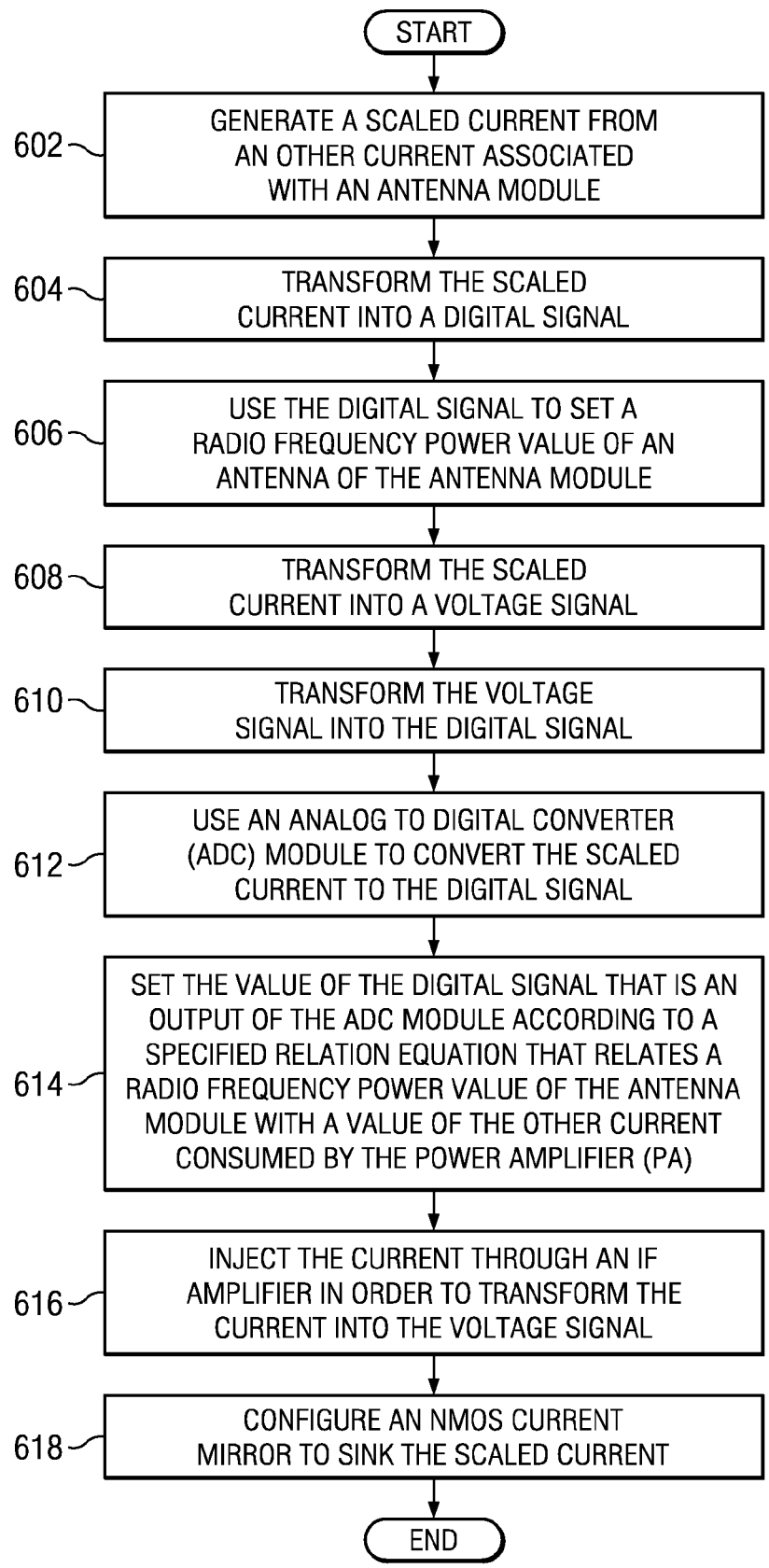
FIG. 6 is a process flow for generating a scaled current and transforming the scaled current to digital signal for setting the radio frequency of an antenna, according to one embodiment.

FIG. 6 is a process flow for generating a scaled current and transforming the scaled current to digital signal for setting the radio frequency of an antenna, according to one embodiment. In operation 602, a scaled current (e.g., the mirror current 110 of FIG. 1) from an other current may be generated (e.g., using the sense module 206 of FIG. 2) associated with an antenna module (the antenna module 122 of FIG. 1). In operation 604, the scaled current may be transformed (e.g., using the converter module 108 of FIG. 1) into a digital signal. In operation 606, the digital signal may be used (e.g., using the converter module 108) to set a transmitted RF Power value power value of an antenna (e.g., the antenna 222 of FIG. 2) of the antenna module 122. A current mirror circuit 106 (e.g., the current mirror circuit of FIG. 1) may generate the scaled current (e.g., using the sense module 206 of FIG. 2) coupled with a low dropout regulator (e.g., the LDO 104) coupled with a power amplifier (PA) (e.g., the power amplifier 102 of FIG. 1) used to drive the antenna module 122. The scaled current may be scaled to the other current value. In operation 608, the scaled current may be transformed (e.g., using the IF amplifier 508 of FIG. 5) into a voltage signal.

In operation 610, the voltage signal may be transformed (e.g., using the converter module 108 of FIG. 1) into the digital signal. The scaled current may be scaled to a value of 50 to 500 times less than the other current. The other current may be a direct current (DC) 114 of the power amplifier 102. The current mirror circuit 106 may be include transistors (e.g., the programmable transistor 306A-N of FIG. 3) coupled to an other transistor of the LDO 104. A width value and a length value of the transistor may be scaled to an other width value and an other length value of the other transistor. The PA 100 may be a differential PA and a single-ended PA. The current mirror circuit 106 may include transistors (e.g., the programmable transistor 306A-N of FIG. 3) coupled to the other transistor of the LDO 104.

The transistors (e.g., the programmable transistor 306A-N of FIG. 3) may be programmable according to a transistor control module (e.g., the control module 300 of FIG. 3). In operation 612, an analog to digital converter (ADC) module (e.g., the analog to digital converter (ADC) module 112 of FIG. 1) may be used (e.g., using the converter module 108 of FIG. 1) to convert the scaled current to the digital signal. In operation 614, the value of the digital signal that may be an output of the ADC module 112 may be settled (e.g., using the digital base band (DBB) module 124 of FIG. 1) according to a specified relation equation that may relate the transmitted RF Power value of the antenna module 122 with a value of the other current consumed by the power amplifier 102(PA).

The ADC module 112 may be located in a receiver circuit of a transceiver circuit associated with the antenna module 122. The transceiver circuit may be based on time division multiplexing (TDM). The transceiver circuit may be based on frequency division multiplexing (e.g., the frequency division multiplexer transceiver 302 of FIG. 3). In operation 616, the scaled current may be injected (e.g., using the IF amplifier 508 of FIG. 5) through an IF amplifier 508 in order to transform the current into the voltage signal. The specified relation equation may be $P_{RF}=a(I_{DC}-I_0)^2+b(I_{DC}-I_0)+c$ where a, b and c are constant gain parameters, $I_0$ may be an offset correction, and $I_{DC}$ may be the value of the other current. The IF amplifier 508 may include a resistor with a specified value through which the scaled current may be injected into the ADC module 112. In operation 618, an NMOS current mirror may be configured (e.g., using the converter module 108) to sink the scaled current.

Figure 7:
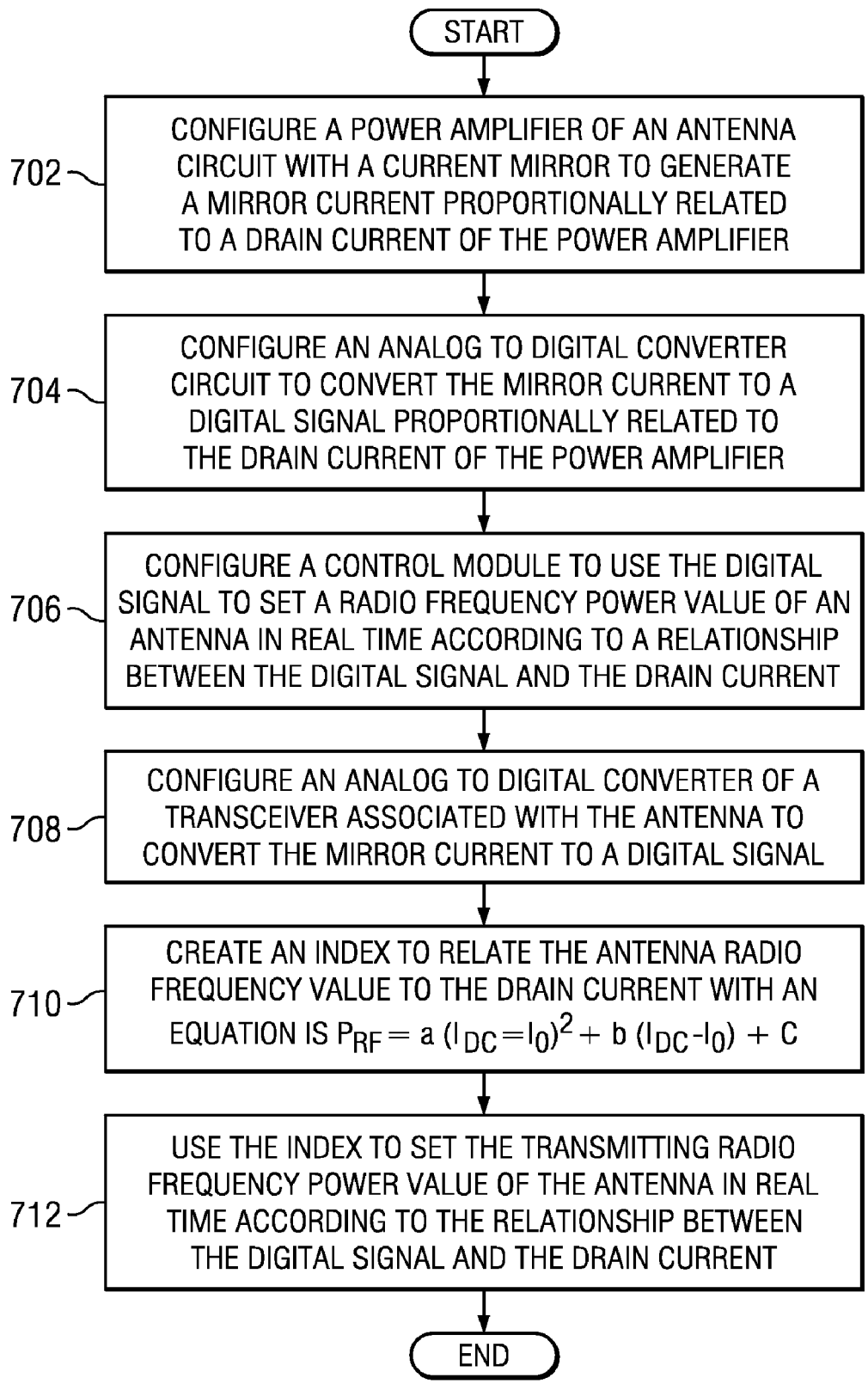
FIG. 7 is a process flow for configuring a power amplifier, an analog to digital converter, and a control module for setting a radio frequency value of an antenna, according to one embodiment.

FIG. 7 is a process flow for configuring a power amplifier, an analog to digital converter, a control module for setting a transmitted RF Power value of an antenna, according to one embodiment.

In operation 702, a power amplifier 102 of an antenna circuit may be configured with a current mirror to generate (e.g., using the sense module 206) a mirror current (e.g., the mirror current 110 of FIG. 1) proportionally related to a drain current (e.g., the drain current 114 of FIG. 1) of the power amplifier 102. In operation 704, an analog to digital converter (e.g., the analog to digital converter module 112 of FIG. 1) circuit may be configured to convert (e.g., using the converter module 108 of FIG. 1) the mirror current 110 to the digital signal proportionally related to the drain current 114 of the power amplifier 102. In operation 706, a control module 300 may be configured (e.g., using the digital base band (DBB) module 124 of FIG. 1) to use the digital signal to set an antenna transmitted RF Power value of an antenna (e.g., the antenna 222 of FIG. 2) in real time according to a relationship between the digital signal and the drain current 114.

In operation 708, the analog to digital converter of a transceiver may be configured with the antenna 222 to convert (e.g., using the converter module 108 of FIG. 1) the mirror current 110 to a digital signal. In operation 710, an index to relate the antenna 222 transmitted RF Power value may be created (e.g., using the power amplifier (PA) module 100 of FIG. 1) to the drain current 114 with an equation may be $P_{RF}=a(I_{DC}-I_0)+b(I_{DC}-I_0)+c$, where a, b and c are constant gain parameters, $I_0$ may be an offset correction, and $I_{DC}$ may be the value of an other current.

In operation 712, the index to set (e.g., using the sense module 206 of FIG. 2) the antenna transmitted RF Power value of the antenna 222 in real time may be used according to the relationship between the digital signal and the drain current 114. The current mirror may be coupled to a final stage low dropout regulator (LDO 104) associated with the power amplifier 102.

Although the present embodiments have been described with reference to specific example embodiments, it will be evident that various modifications and changes may be made to these embodiments without departing from the broader spirit and scope of the various embodiments. For example, the various devices, modules, analyzers, generators, etc. described herein may be enabled and operated using hardware circuitry (e.g., CMOS based logic circuitry), firmware, software and/or any combination of hardware, firmware, and/or software (e.g., embodied in a machine readable medium).

For example, the various electrical structure and methods may be embodied using transistors, logic gates, and electrical circuits (e.g., application specific integrated (ASIC) circuitry and/or in Digital Signal Processor (DSP) circuitry).

Particularly, the power amplifier module 100, the converter module 108, the ADC module 112, the antenna module 122, and the DBB module 124 of FIG. 1, the sense module 206 of FIG. 2, the control module 300 of FIG. 3 may be enabled using a power amplifier circuit, a converter circuit, an ADC circuit, a antenna circuit, a DBB circuit a sense circuit, a control circuit, and other circuit.

In addition, it will be appreciated that the various operations, processes, and methods disclosed herein may be embodied in a machine-readable medium and/or a machine accessible medium compatible with a data processing system (e.g., a computer system), and may be performed in any order (e.g., including using means for achieving the various operations). Accordingly, the specification and drawings are to be regarded in an illustrative rather than a restrictive sense.

What is claimed is:

1. A method comprising:
   generating a scaled current from another current associated with an antenna module;
   transforming the scaled current into a digital signal; and
   using the digital signal to set a radio frequency power value of an antenna of the antenna module:
   using an analog to digital converter (ADC) module, located in a receiver circuit of a transceiver circuit associated with the antenna module, to convert the scaled current to the digital signal, the transceiver circuit including a frequency division multiplexer;
   setting the value of the digital signal that is an output of the ADC module according to a specified relation equation that relates a radio frequency power value of the antenna module with a value of the another current consumed by the power amplifier (PA);
   injecting the current through an IF amplifier in order to transform the current into the voltage signal; and
   wherein the specified relation equation is $P_{RF}=a\,(I_{DC}-I_0)^2+b\,(I_{DC}-I_0)+c$ wherein a, b and c are constant gain parameters, $I_0$ is an offset correction, and $I_{DC}$ is the value of the another current.

2. The method of claim 1:
   wherein the scaled current is generated by a current mirror circuit coupled with a low dropout regulator (LDO) coupled with a power amplifier (PA) used to drive the antenna module;
   wherein the scaled current is scaled to the another current value;
   further comprising transforming the scaled current into a voltage signal; and
   further comprising transforming the voltage signal into the digital signal.

3. The method of claim 2:
   wherein the current is scaled to a value of 50 to 500 times less than the another current; and
   wherein the another current is a direct current (DC) drain current of the power amplifier.

4. The method of claim 2:
   wherein the current mirror circuit is a transistor coupled to another transistor of the LDO; and
   wherein a width value and a length value of the transistor are scaled to another width value and another length value of the other transistor.

5. The method of claim 4:
   wherein the PA is at least one of a differential PA OR a single-ended PA;
   wherein the current mirror circuit is comprised of a plurality of transistors coupled to the other transistor; and
   wherein the plurality of transistors are programmable according to a transistor control module.

6. The method of claim 1:
   wherein the transceiver circuit is based on time division multiplexing (TDM).

7. The method of claim 1 wherein the IF amplifier includes a resistor with a specified value through which the scaled current is injected into the ADC module.

8. The method of claim 7 further comprising configuring an NMOS current minor to sink the scaled current.

9. A system comprising:
   a power amplifier (PA) module to provide a drain current and wherein the PA is associated with an antenna;
   a sense module to generate a mirror current proportional to the drain current with a current mirror; and
   a converter module to convert the minor current into a digital signal used to set a radio frequency power of the antenna, wherein the converter module comprises a resistor terminated at an output of an Intermediate Frequency (IF) amplifier coupled in series with a second current minor and an analog to digital converter (ADC), wherein the second current mirror sinks the mirror current.

10. The system of claim 9 further comprising a digital base banding (DBB) module to use the digital signal to set the radio frequency power of an antenna module in real time.

11. The system of claim 9:
    wherein the converter module is an existing analog to digital converter (ADC) of a receiver circuit of a transceiver associated with the antenna module wherein a value of the digital signal that is an output of the ADC is according to a specified relation equation that relates a radio frequency power value of the antenna module with a value of the other current consumed by the power amplifier (PA), wherein the specified relation equation is $P_{RF}=a\,(I_{DC}-I_0)^2+b\,(I_{DC}-I_0)+c$ wherein a, b and c are constant gain parameters, $I_0$ is an offset correction, and $I_{DC}$ is the value of the other current; and
    wherein the transceiver is based on time division multiplexing.

12. The system of claim 9:
    wherein a low dropout regulator (LDO) pass transistor provides the drain current; and
    wherein the current mirror is coupled with a transistor of the LDO pass transistor.

13. A system comprising:
    a power amplifier (PA) module to provide a drain current and wherein the PA is associated with an antenna and is selected from a group comprising a substantially class-A PA, a class A-B PA, a class-B PA, a class-C PA, a deep class-C PA and a switch-typed PA;
    a sense module to generate a mirror current proportional to the drain current with a current mirror; and
    a converter module to convert the mirror current into a digital signal used to set a radio frequency power of the antenna.

14. The system of claim 9:
    wherein the converter module is a resistor coupled to an Intermediate Frequency (IF) amplifier and an analog to digital converter (ADC); and
    wherein to the IF amplifier is used to convert the mirror current to a voltage signal and to terminate the resistor.

15. The system of claim 14:
    wherein the second current mirror comprises at least one n-channel MOSFET wherein the second current mirror in series with the resistor avoids signal current from passing directly through the IF amplifier and ensures that only signal voltage generated across the resistor added to voltage set at the output of the IF amplifier is received by the ADC; and wherein the sense module uses a plurality of programmable current mirrors to generate the mirror current.

16. A method comprising:

configuring a power amplifier of an antenna circuit with a current mirror to generate a mirror current proportionally related to a drain current of the power amplifier;

configuring an analog to digital converter circuit to convert the mirror current to a digital signal proportionally related to the drain current of the power amplifier; and configuring a control module to use the digital signal to set transmitted radio frequency (RF) power value of an antenna in real time according to a relationship between the digital signal and the drain current;

configuring an analog to digital converter of a transceiver associated with the antenna to convert the mirror current to a digital signal;

creating an index to relate the antenna transmitted RF power value to the drain current with an equation $P_{RF}=a(I_{DC}-I_0)^2+b(I_{DC}-I_0)+c$, wherein a, b and c are constant gain parameters, $I_0$ is an offset correction, and $I_{DC}$ is the value of an other current;

using the index to set the antenna transmitted RF power value of the antenna in real time according to the relationship between the digital signal and the drain current; and wherein the current mirror is coupled to a final stage low dropout regulator (LDO) of the power amplifier.

17. A method for detecting on chip RF power for a power amplifier, comprising:

generating a scaled current from a current associated with an antenna module;

transforming the scaled current into a voltage signal using a resistor terminated at an output of an intermediate frequency (IF) amplifier;

passing only the voltage signal through the IF amplifier using a resistor coupled in series with a current mirror used as a current sink;

transforming the scaled current into a voltage signal digital signal; and using the digital signal to set a radio frequency power value of an antenna of the antenna module.

* * * * *